United States Patent
Beyrle et al.

(10) Patent No.: US 12,049,093 B2
(45) Date of Patent: Jul. 30, 2024

(54) SCREEN-PRINTING SCREEN AND PROCESS FOR OBTAINING GLAZINGS EQUIPPED WITH ELECTRICALLY CONDUCTIVE PATTERNS

(71) Applicant: SAINT-GOBAIN GLASS FRANCE, Courbevoie (FR)

(72) Inventors: André Beyrle, Tracy le Val (FR); Samuel Lepretre, Compiegne (FR)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 1261 days.

(21) Appl. No.: 16/621,890

(22) PCT Filed: Jun. 15, 2018

(86) PCT No.: PCT/FR2018/051426
§ 371 (c)(1),
(2) Date: Dec. 12, 2019

(87) PCT Pub. No.: WO2018/229449
PCT Pub. Date: Dec. 20, 2018

(65) Prior Publication Data
US 2021/0146706 A1    May 20, 2021

(30) Foreign Application Priority Data
Jun. 16, 2017  (FR) ........................ 1755508

(51) Int. Cl.
*B41M 1/34*  (2006.01)
*B41C 1/14*  (2006.01)
(Continued)

(52) U.S. Cl.
CPC ............ *B41M 1/34* (2013.01); *B41C 1/14* (2013.01); *B41M 1/12* (2013.01); *B41N 1/247* (2013.01);
(Continued)

(58) Field of Classification Search
CPC ......... B41C 1/14; H01L 21/3715; H05B 3/84; H05B 3/86; H05K 2203/304
See application file for complete search history.

(56) References Cited

U.S. PATENT DOCUMENTS 4,958,560 A    9/1990    Collins

FOREIGN PATENT DOCUMENTS

EP    0 281 351 A1    9/1988
EP    0281351 A1 *   9/1988
(Continued)

OTHER PUBLICATIONS

SEFAR Vario: "The special mesh for screen printing rear windscreens," Dec. 2008, XP002785937, Retrieved from the Internet: URL:http://www.sefar- singapore.com.sg/cms/medien.nsf/img/90300B92D88F82A5C1256F88003272F9/$ FILE/spleafletVarioleben.pdf, 4 pages. (Year: 2008).*

(Continued)

*Primary Examiner* — Michael G Miller
(74) *Attorney, Agent, or Firm* — Pillsbury Winthrop Shaw Pittman LLP

(57) ABSTRACT

A screen-printing screen for printing electrically conductive patterns on glass sheets, includes a main mask, the aperture size of the main mask being larger in a lateral portion than in the central portion, the screen furthermore including, in at least one double-mask zone, located in the central portion, at least one secondary mask fastened to a face of the main mask, the aperture size of the or each secondary mask being larger than the aperture size of the main mask in the central portion, and the mesh of the or each secondary mask making, with the mesh of the main mask, an angle α comprised between 1 and 89°.

20 Claims, 1 Drawing Sheet

(51) Int. Cl.
*B41M 1/12* (2006.01)
*B41N 1/24* (2006.01)
*H01L 21/67* (2006.01)
*H05B 3/84* (2006.01)
*H05B 3/86* (2006.01)

(52) U.S. Cl.
CPC ........... *H01L 21/6715* (2013.01); *H05B 3/84* (2013.01); *H05B 3/86* (2013.01); *H05K 2203/304* (2013.01)

(56) References Cited

FOREIGN PATENT DOCUMENTS

| | | |
|---|---|---|
| JP | S56-069464 U | 6/1981 |
| JP | H07-081262 A | 3/1995 |
| KR | 1995-0008175 B1 | 7/1995 |
| WO | WO 2004/082069 A1 | 9/2004 |
| WO | WO 2009/053469 A2 | 4/2009 |
| WO | WO-2009053469 A2 * | 4/2009 .............. B41M 1/34 |

OTHER PUBLICATIONS

Machine translation, WO 2009053469 (Year: 2009).*
International Search Report as issued in International Patent Application No. PCT/FR2018/051426, dated Nov. 6, 2018.
SEFAR® Vario: "The special mesh for screen printing rear windscreens," Dec. 2008, XP002785937, Retrieved from the Internet: URL:http://www.sefar-singapore.com.sg/cms/medien.nsf/img/90300B92D88F82A5C1256F88003272F9/$FILE/sp_leafletVario_leb_en.pdf, 4 pages.

* cited by examiner

SCREEN-PRINTING SCREEN AND PROCESS FOR OBTAINING GLAZINGS EQUIPPED WITH ELECTRICALLY CONDUCTIVE PATTERNS

CROSS-REFERENCE TO RELATED APPLICATIONS

This application is the U.S. National Stage of PCT/FR2018/051426, filed Jun. 15, 2018, which in turn claims priority to French patent application number 1755508 filed Jun. 16, 2017. The content of these applications are incorporated herein by reference in their entireties.

The present invention relates to the field of screen printing electrically conductive, in particular silver-based, patterns on glazings.

Electrically conductive patterns, such as heating wires, antennas or other sensors present in motor-vehicle glazings are made from a conductive paste, such as for example a silver-containing paste, screen printed onto a glass sheet, and are connected to an electrical supply system by way of connectors soldered to the conductive paste. The connectors are soldered in certain well-defined zones of the glazing and the alloys currently used to produce these solder joints are lead-free alloys based on silver, tin and copper.

Glazings equipped with such electrically conductive devices must, in order to be able to be placed on the market and to be accepted by motor-vehicle manufacturers, successfully pass increasingly strict resistance tests. The alloys used for the solders must in particular meet the criteria required by a TCT test (or temperature cycling test). The objective of this test is to determine whether the glazing, once equipped with electrical functions, is able to withstand successive rapid increases and decreases in temperature, without being weakened. These tests were developed to accelerate the appearance of effects caused by differences in the thermal behavior of the various components of a system. The new test requires temperature to be varied between −40° C. and +105° C., which is a larger range of variation than used in previous tests, which were limited to 90° C. The number of cycles has also been changed since it has passed from 10 cycles to a minimum of 60 cycles. The new TCT conditions also require that a voltage of 14 V be applied during these temperature variations in the phases in which temperature is increased, thereby generating additional heat corresponding to local temperatures that may be as high as approximately 120° C. To successfully pass these tests, it has proved necessary to increase the thickness of the electrically conductive patterns, in particular in the soldering zones, i.e. in the zones in which the connectors are placed and in which the solder joints are produced with the lead-free alloy. In a motor-vehicle glazing, the soldering or connection zones are generally located in the bus bars located on either side of the heating network, in the lateral portions of the glazing, but they may also be located in more central portions.

It is known to print by screen printing in a single step electrically conductive patterns of thickness that differs between the central portion and lateral portions, using one and the same printing cloth (or mask) the size of the apertures of which varies depending on the zone and allows patterns of different thickness to be printed. These cloths in particular allow, in the lateral portions of glazings, larger thicknesses of pastes to be deposited for the bus bars, while keeping, in the central portion, thin electrically conductive tracks that not easily seen. Thus, thickness is sufficiently large in the locations in which connections and weld joints are produced, but small enough in the central portion not to decrease visibility. This type of variable-aperture-size cloth does not however allow, in the central portion of the glazing, thin patterns and thicker patterns to be obtained simultaneously. However, certain soldering spots, in particular antenna buttons, are often positioned at the center of the printed heating networks, in zones below or above the central portion of the glazing. To obtain an electrically conductive pattern of a larger thickness in certain zones of the central portion of the glazing, it is currently necessary to carry out two screen-printing operations since variable-aperture-size masks allow large thicknesses to be obtained only in the lateral portions, on the glazing edges. Thus, to obtain a larger thickness in the central portion of a glazing, an electrically conductive paste is screen printed in a first printing pass, then the paste is dried before carrying out a second printing pass identical to the first in a second printing station. This technology therefore requires heavy investment, since it requires at the very least an IR drying device and a second printing station. In certain cases, if the required thickness is even larger, it may be necessary to carry out a third screen-printing step, again with intermediate drying.

It has therefore been sought to develop a simplified and less expensive process allowing thick electrically conductive patterns to be produced in any location, and in particular in the central portion of a substrate away from the bus bars. Document EP0281351 describes a screen-printing process allowing a thicker layer of ink to be obtained using, in addition to the main screen-printing screen, a second screen segment that is adhesively bonded to the coated surface of the screen. The additional screen segment has apertures of larger size than those of the main screen. However, it turns out that simply superposing a given screen segment does not allow electrically conductive patterns of a quality that is satisfactory for the sought-after applications to be obtained. It is in this context that the present invention was made. The invention proposes to produce a glazing coated with electrically conductive patterns of thickness that varies depending on the portion of the glazing on which the patterns are deposited, and in particular to produce a pattern that is considered to be thick in a central portion of the glazing.

One subject of the invention is a screen-printing screen for printing electrically conductive patterns on glass sheets, comprising a main mask possessing a central portion and at least one lateral portion, the aperture size of the main mask being larger in said at least one lateral portion than in said central portion, said screen furthermore comprising, in at least one zone, called the double-mask zone, located in said central portion, at least one secondary mask fastened to a face of said main mask, the aperture size of the or each secondary mask being larger than the aperture size of the main mask in said central portion, and the mesh of the or each secondary mask making, with the mesh of the main mask, an angle α comprised between 1 and 89°.

Such a screen allows glazings possessing, in their central portion, electrically conductive tracks of small thickness and, in the double-mask zone, and therefore also in the central portion of the glazing, electrically conductive patterns, for example welding zones for antenna buttons, that are particularly thick, to be obtained in a single screen-printing pass. In the rest of the text, these patterns will be referred to as "thick electrically conductive patterns" or "thick patterns".

In the rest of the text, the expression "double-mask zone" designates the portions of the screen comprising both the main mask and the secondary mask, and by extension the corresponding portions of the glazing that will be screen printed using this screen. Conversely, all the other portions of the screen, in which portions only the main mask is used, and by extension the corresponding portions of the glazing, will be qualified "single-mask zones".

The arrangement of the apertures of the secondary mask with respect to those of the main mask, at the angle α, allows a better control of the differences in thickness of the electrically conductive patterns between the double-mask zones and the single-masks zones. Specifically, it is important for this difference not to exceed 100 μm in order to prevent any interruption of the electrically conductive track in the precise location where the latter changes thickness. It is also important to well control the level of openness of the two masks and therefore the transfer of electrically conductive paste. In these various respects, the best results are obtained when the angle α is comprised between 15 and 35°, and more particularly between 17 and 27°.

Preferably, the screen is rectangular or substantially rectangular, and the central portion corresponds to the rectangular portion extending the entire length of the short sides of the screen and the perpendicular bisector of the short sides of which corresponds to the perpendicular bisector of the long sides of the screen, and occupies 20 to 40% of the area of the screen. The screen preferably comprises two lateral portions, corresponding to the two rectangular portions placed symmetrically with respect to the perpendicular bisector of the long sides of the rectangle, on either side of the latter, occupying 20 to 40% of the area of the screen.

The main mask is preferably such that the number of wires per cm in the central portion is higher than the number of wires per cm in the at least one lateral portion, and the diameter of the wires in the central portion is smaller than the diameter of the wires in the at least one lateral portion. It is advantageously possible to choose:

in the central zone, 77 wires per cm for a diameter of 48 μm, 77 wires per cm for a diameter of 55 μm, and 90 wires per cm for a diameter of 48 μm; and in the or each lateral zone, 42 wires per cm for a diameter of 80 μm, 48 wires per cm for a diameter of 80 μm, and 49 wires per cm for a diameter of 70 μm.

This type of main mask in particular allows a larger thickness of electrically conductive paste to be deposited in the lateral portions, in which the bus bars are located, in comparison to the printing zones corresponding to the thinner wires of the heating network. Mention may be made, by way of example of this type of mesh, of the product Vario® from SEFAR or the product Variant® from SAATI, which then allows in one and the same printing operation, various thicknesses to be obtained in various zones of the glazing.

Preferably, the number of wires per cm of the at least one secondary mask is lower than the number of wires per cm of the main mask in the central portion and the diameter of the wires of the secondary mask is larger than the diameter of the wires of the main mask in the central portion. It is advantageously possible to choose masks having 55 wires per cm for a diameter of 64 μm or 61 wires per cm for a diameter of 64 μm.

The main and secondary masks may be made of any material known to be usable to produce screen-printing screens, for example polyester or polyamide.

The screen comprises one or more double-mask zones, depending on the number of thick patterns to be deposited. The double-mask zones each preferably occupy an area smaller than 10% of the area of the screen, typically between 0.1 and 8%, and in particular between 0.5 and 5%. The double-mask zone (and therefore the secondary mask) must be larger in size then the thick electrically conductive layer to be deposited. The shape of the double-mask zone (and therefore of the secondary mask) may for example be circular or ellipsoidal.

Preferably, some of the apertures of which are blocked with a resin obtained by exposing a photocrosslinkable emulsion, the secondary mask being fastened to a face of the main mask using said resin, as explained in more detail in the rest of the text.

Another subject of the invention is a process for obtaining a screen-printing screen according to the invention. This process comprises the following steps:

a) coating a photocrosslinkable emulsion onto at least one portion of the surface of the main mask; then b) applying, on one face of the main mask, in the or each zone intended to become a double-mask zone, a secondary mask to the still-wet photocrosslinkable emulsion, in order to form said at least one double-mask zone; then c) drying the screen; then d) exposing the screen in order to crosslink the photocrosslinkable emulsion in preset zones; then e) washing and drying the screen.

The various features described above with reference to the screen according to the invention, for example the features of the secondary and main mask, are obviously applicable to this process according to the invention.

According to one preferred embodiment, in step a) a photocrosslinkable emulsion is coated onto the entirety of the surface of the main mask. Step a) is then carried out on a "virgin" main mask, the apertures of which are not blocked beforehand, this embodiment implementing only a single exposing step to produce the final screen.

According to another, less preferred, embodiment, in step a) a photocrosslinkable emulsion is only coated onto the or each zone to which a secondary mask will be applied in step b). In this embodiment, step a) is therefore carried out on a main mask the entire surface of which has already been coated with a photocrosslinkable emulsion, and which is then exposed. It is therefore a reworking process in which the or each secondary mask is fastened to an already formed screen. Contrary to the preferred embodiment that was just described, this embodiment therefore implements in total two exposing steps.

Before the step a), the process preferably comprises a step of pre-identifying, on the main mask, a zone corresponding to a zone in the center of which it is desired to obtain a thick electrically conductive pattern, said zone being located in a central portion of the glazing. It is therefore a question of the zone intended to become a double-mask zone.

In step a), any type of emulsion conventionally used for screen-printing screens may be chosen. The emulsion is preferably coated onto both faces of the main mask. The photocrosslinkable emulsion allows the apertures of the screen to be selectively blocked in the zones subjected to the exposure, step e) in particular serving to remove the emulsion from zones not subjected to the exposure, and therefore from the portions or the apertures that must remain unblocked and through which the printing paste must pass during the screen printing and coat the glass sheet to form the electrically conductive patterns.

In step b), the secondary mask is applied to the specific location in which it is desired, subsequently, to obtain electrically conductive patterns of larger thickness. The secondary mask is applied to the still-wet emulsion, thereby allowing the emulsion to play the role of binder between the two masks. At the moment of the application, some of the thickness of the emulsion passes through the secondary mask, in the same way that ink passes through blotting paper, so that the secondary mask naturally conforms to the main mask, the adhesion between the two masks then being excellent. A slight pressure may be applied to the surface of the secondary mask for example with a spatula, in order to prevent any inclusion of air bubbles that could be detrimental to the achievement of a good printing quality.

In step b), the or each secondary mask may be applied to either one of the faces of the main mask. Preferably, the or each secondary mask is applied to the face of the main mask that will be located on the side of the glass sheet during the screen printing, in order to prevent the secondary mask from being prematurely damaged or shorn off by the printing squeegee that is used to print the electrically conductive silver paste.

The or each secondary mask is preferably cut beforehand using a cutting die from a mask of larger dimensions, called the source mask. Specifically, an extremely clean cut is required to obtain a defect-free outline on the periphery of the secondary mask. Cut fibers that would be present on the borders of the secondary mask if the secondary mask were not cut cleanly enough, could cause defects, such as breaks in conductive wires, that are incompatible with the resolution required for automotive applications. Preferably, the source mask has a first axis of symmetry, parallel to the mesh of said source mask, the secondary mask has a second axis of symmetry, and the cutting is carried out so that the first and second axes of symmetry make the angle $\alpha$. It is thus easier to ensure the angle $\alpha$ is obtained when the secondary mask is fastened to the main mask.

The drying step c) is preferably carried out at a temperature comprised between 30 and 40° C.

The process according to the invention preferably comprises, between steps c) and d), the following steps:
 b') coating the screen with an additional photocrosslinkable emulsion in the double-mask zone; then
 c') drying the screen.

This addition of emulsion makes it possible to ensure that the required thickness will indeed be obtained after baking, and also to improve the resolution of the outline of the pattern to be screen printed by ensuring the apertures of the second mask are satisfactorily filled. It also allows the adhesion of the second mask to be improved. It is however necessary to well control the quantity of emulsion added because an excess of emulsion or any application defect could lead to the creation of undesired defects in the quality with which the electrically conductive paste is printed.

Step d) is the exposing step, in which the emulsion is photocrosslinked, generally under the effect of ultraviolet radiation. The exposure power is typically the power conventionally implemented in the manufacture of conventional screens. Specifically, the fact of having "double-mask" zones does not require any actual modifications to be made to this step of the process, excepting a possible slight increase in exposure time. As is known, this step d) is typically carried out by placing the mask against a transparency comprising a transparent medium, typically made of polyester, coated with patterns of an ink that is opaque to the ultraviolet radiation, corresponding to the electrically conductive patterns to be printed on the glazing, then by irradiating said transparency by means of ultraviolet radiation. The emulsion is therefore cross-linked and blocks the apertures of the mask only in the portions of the screen located under the portions of the transparency not covered with ink. In the other portions, the emulsion is not cross-linked and is removed in step e), leaving the apertures open, so that the paste can pass through them during the screen printing. Patterns that are identical to those featuring on the transparency are therefore produced on the glazing.

Immediately before the exposing step d), the method advantageously comprises a step of centering the transparency on the screen, so as to ensure the correct alignment of the double-mask zone.

Another subject of the invention is a process for obtaining a glazing coated on one of its faces with electrically conductive patterns located in at least one lateral portion and in a central portion of the glazing, said electrically conductive patterns comprising electrically conductive tracks of thickness e1 located in the or each lateral portion and electrically conductive tracks of thickness e2 located in the central portion, the thickness e1 being larger than the thickness e2, said patterns furthermore comprising, in the central portion, at least one what is called thick electrically conductive pattern, said process comprising screen printing said electrically conductive patterns in a single pass, by way of the following steps:
 a screen-printing screen according to the invention, or a screen-printing screen able to have been obtained with the process described above, is positioned facing a glass sheet, said screen being placed so that the central and lateral portions of the screen are in correspondence with the portions of the glass sheet that are intended to become the central and lateral portions of the glazing, respectively, and so that the or each double-mask zone is in correspondence with a zone of the glass sheet that is intended to be coated with a thick electrically conductive pattern; then
 an electrically conductive, in particular silver-containing, paste is deposited on the screen-printing screen in particular using a squeegee.

By virtue of the screen according to the invention, this process makes it possible to obtain, in a single screen-printing step, in the central portion of the glazing, both electrically conductive tracks of small thickness, for example a network of heating wires or antennas, and at least one thick electrically conductive pattern, for example a soldering zone for an antenna button, which may be located in the middle of said network.

The screen is preferably placed so that the or each secondary mask is turned toward the glass sheet, for the reasons indicated above, i.e. in order to prevent the secondary mask from being prematurely damaged or shorn off by the printing squeegee.

Preferably, the silver-containing electrically conductive paste comprises, in the wet state, at most 75%, and in particular at most 70%, by weight silver, for example 66 to 75%, and in particular from 68 to 70% by weight silver. These pastes having a low silver content compared to the pastes conventionally employed, are particularly suited to lead-free solders. These low silver contents in contrast require, in order to ensure a good solderability and a good resistance to the TCT test, larger thicknesses thereof to be applied, this being made possible by virtue of the process according to the present invention.

The glazing may optionally be dried after the paste has been applied. The glazing then undergoes a heat treatment in order to make the paste. This heat treatment is typically a treatment for bending the glass.

The lower the silver content in the paste, the thicker the patterns must be in the wet state (before baking) for a given pattern thickness after baking. Thus, for a pattern thickness of 10 μm after baking, the thickness in the wet state is typically about 30 μm for a paste containing 75% by weight silver, and about 50 μm for a paste containing 70% by weight silver.

The thickness in the wet state of the or each thick electrically conductive pattern is advantageously from 30 to 60 μm, in order to obtain, after baking, thicknesses $e_3$ from 8 to 15 μm, and in particular from 8 to 12 μm.

The glass sheet is typically made of soda-lime glass, but may be made of other types of glass, for example of borosilicate or aluminosilicate glass. It may be clear, or preferably tinted, for example green, grey or blue. After screen printing, the glass sheet may undergo various treatments conventionally implemented in the field of the manufacture of automotive glazings, such as bending and/or tempering treatments intended to provide the glazing with the desired shape and mechanical strength, and to simultaneously bake the paste.

The last subject of the invention is a glazing coated on one of its faces with electrically conductive patterns, in particular silver-containing patterns, obtained by screen printing and located in at least one lateral portion and in a central portion of the glazing, said electrically conductive patterns comprising electrically conductive tracks of thickness $e_1$ located in the or each lateral portion and electrically conductive tracks of thickness $e_2$ located in the central portion, the thickness $e_1$ being larger than the thickness $e_2$, said electrically conductive patterns furthermore comprising, in the central portion, at least one what is called thick electrically conductive pattern, the thickness $e_3$ of which is at least 8 μm, in particular comprised between 8 and 15 μm, and is larger than the thickness $e_2$.

In the description of the glazing, and therefore of the finished product, the thicknesses of the patterns are all measured and expressed after the baking step.

Preferably:
the thickness $e_1$ is comprised between 8 and 15 μm, and for example is about 10 μm; and/or
the thickness $e_2$ is comprised between 2 and 5 μm, and for example is about 3 μm; and/or
the thickness $e_3$ is at most 12 μm and/or
$e_3$ is substantially equal to $e_1$.

The glazing according to the invention is preferably a motor-vehicle rear windshield, the electrically conductive patterns in particular being antennas, bus bars and/or heating wires, and the or each thick electrically conductive pattern being a soldering zone for antenna connection.

The invention will be better understood in light of the following example embodiments, which are illustrated by FIGS. 1 and 2.

Figure 1:
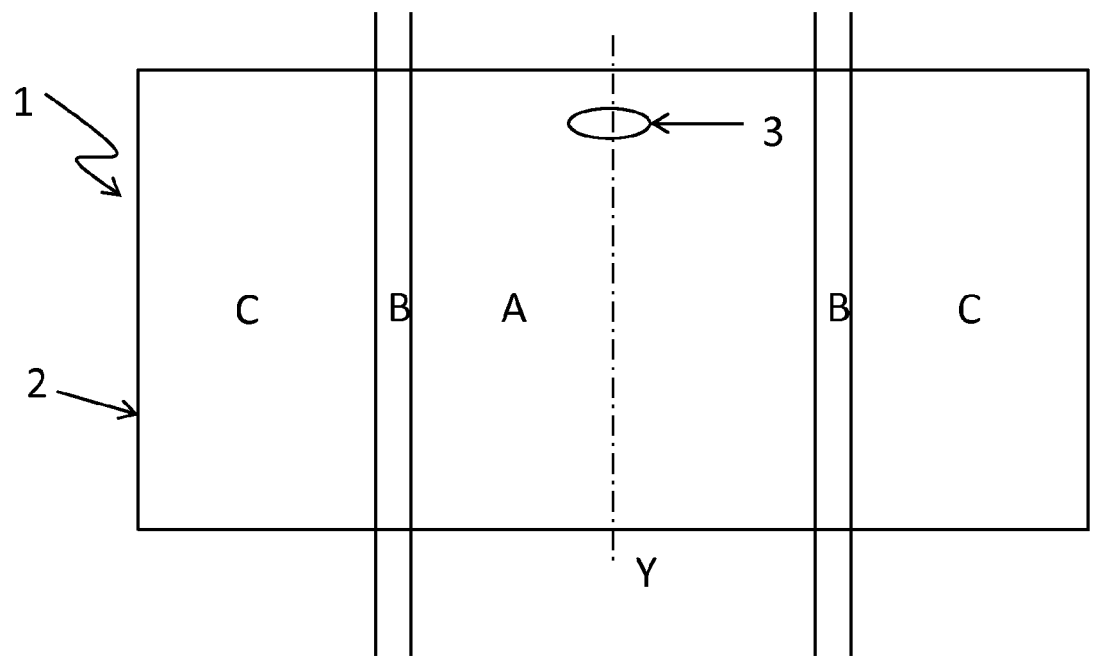
FIG. 1 shows a screen-printing screen according to the invention.

In FIG. 1, the screen 1 comprises a variable-aperture-size main mask 2 allowing electrically conductive patterns of various thicknesses to be obtained on one and the same glass sheet using a single cloth. This main mask is of rectangular shape and comprises a central portion A the perpendicular bisector of the short sides of which corresponds to the perpendicular bisector Y of the long sides of the main mask 2. By way of example, the cloth of the main mask 2 in the central portion A comprises 90 wires per cm, each of the wires having a diameter of 48 μm.

The main mask 2 also comprises two lateral portions C, which portions are rectangular and placed symmetrically with respect to the perpendicular bisector Y, on either side of the latter. The cloth in the portions C comprises for example 48 wires per cm, each of the wires having a diameter of 80 μm.

The portions B shown in FIG. 1 correspond to transitional zones between the portion A and the portions C.

The screen 1 also comprises, in the central portion A, and fastened to the main mask 2 by virtue of the photocrosslinkable emulsion, a secondary mask 3, here of ellipsoidal shape. The double-mask zone located in this position is intended to print a thicker soldering zone. The cloth of the secondary mask 3 for example comprises 55 wires per cm, each of the wires having a diameter of 64 μm. The apertures of the secondary mask make an angle for example of 22° with the apertures of the main mask. To achieve this, the secondary mask was cut from a rectangular source mask using an ellipsoidal cutting die, the major axis of the ellipse making an angle of 22° with the long side of the source mask.

Figure 2:
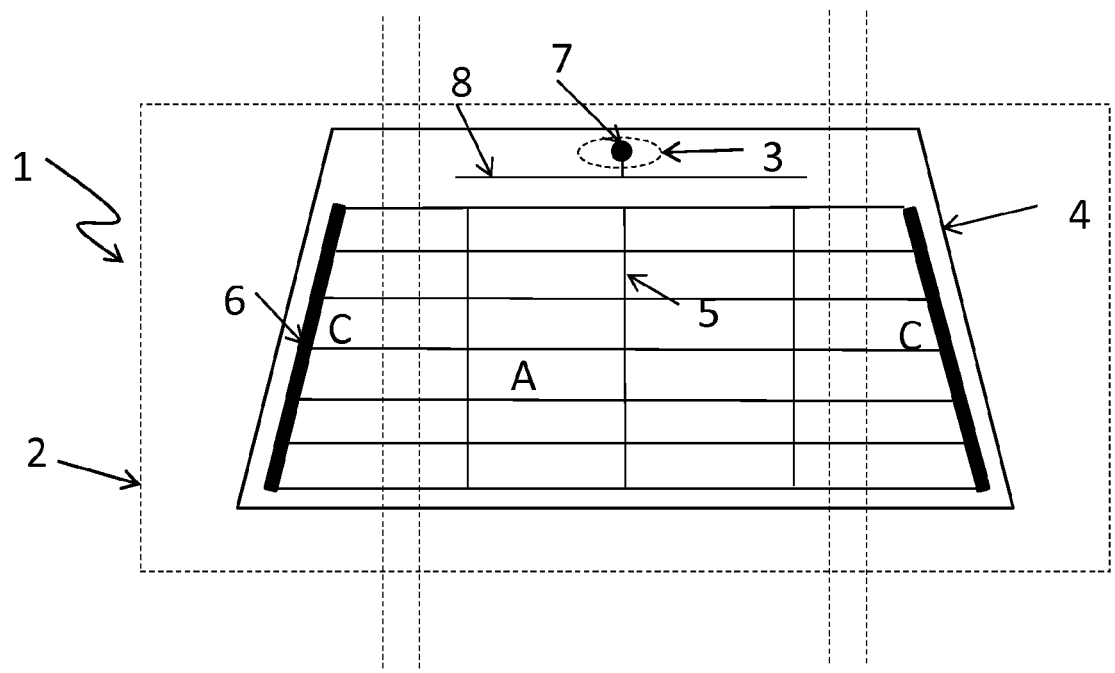
FIG. 2 shows a glazing according to the invention.

FIG. 2 shows a glazing 4 according to the present invention. In this figure, the screen-printing screen 1 and its various constituent portions have been represented by dashed lines in order to clearly show the correspondence between, on the one hand, the elements of the glazing and, on the other hand, the elements of the screen-printing screen that allowed the glazing to be obtained.

The glazing 4 comprises, just like the screen 1, a central portion A and two lateral portions C corresponding to the central and lateral portions of the screen 1, respectively. Electrically conductive patterns 5, 6, 7 and 8 have been printed in these portions A and C, and more precisely a network of horizontal and vertical heating wires 5, which are connected to bus bars 6 in the lateral portions C, an antenna 8 and a soldering zone for an antenna button 7.

These wires and bus bars were printed using the process of the invention, by screen printing a silver-containing paste on the glass sheet, the thickness after baking being in the example 3 μm for the wires 5 and antenna 8 in the central portion A and 10 μm for the bus bars 6 in the lateral portion C. In the central portion A, in the double-mask zone 3, the soldering zone 7, which is electrically connected to the antenna 8, was also printed in the same screen-printing pass. This soldering zone 7 is an electrically conductive pattern that is thicker than the wires 5 or the antenna 8, its thickness being comprised between 8 and 15 μm, and typically being about 10 μm.

In a first comparative example the same screen-printing step was carried out using a screen not comprising a double-mask zone. In a second comparative example, the screen printing was carried out using a screen comprising a double-mask zone, the angle α between the two masks however being 0°. In both cases, the soldering zone 7 was observed not to have the desired thickness after baking, the obtained thickness being only about 3 μm.

The invention claimed is:
1. A process for obtaining a glazing coated on one of its faces with electrically conductive patterns located in at least one lateral portion and in a central portion of the glazing, said electrically conductive patterns comprising electrically conductive tracks of thickness $e_1$ located in the or each lateral portion and electrically conductive tracks of thickness $e_2$ located in the central portion, the thickness $e_1$ being larger than the thickness $e_2$, said patterns furthermore comprising, in the central portion, at least one thick electrically conductive pattern, said process comprising screen printing said electrically conductive patterns in a single pass, by way of the following steps:

positioning a screen-printing screen facing a glass sheet, the screen-printing screen including a main mask possessing a central portion and at least one lateral portion, an aperture size of the main mask being larger in said at least one lateral portion than in said central portion, said screen screen-printing furthermore including, in at least one zone located in said central portion, at least one secondary mask fastened to a face of said main mask, said at least one zone forming a double-mask zone, an aperture size of the or each secondary mask being larger than the aperture size of the main mask in said central portion, a mesh of the main mask extending in a first direction in a surface of said main mask and a mesh of the at least one secondary mask extending in a second direction in a surface of said at least one secondary mask, said first direction making with said second direction an angle α comprised between 1 and 89°, said screen-printing screen being placed so that the central and lateral portions and of the screen-printing screen are in correspondence with the portions of the glass sheet that are intended to become the central and lateral portions of the glazing, respectively, and so that the or each double-mask zone is in correspondence with a zone of the glass sheet that is intended to be coated with a thick electrically conductive pattern; then depositing an electrically conductive paste on the screen-printing screen.

2. The process as claimed in claim 1, wherein the screen-printing screen is obtained by a method comprising the following steps:
   a) coating a photocrosslinkable emulsion onto at least one portion of a surface of the main mask; then
   b) applying, on one face of the main mask, in the or each zone intended to become a double-mask zone, a secondary mask to the still-wet photocrosslinkable emulsion, in order to form said at least one double-mask zone; then
   c) drying the screen; then
   d) exposing the screen in order to crosslink the photocrosslinkable emulsion in preset zones; then
   e) washing and drying the screen.

3. The process as claimed in claim 2, wherein the or each secondary mask is cut beforehand using a cutting die from a mask of larger dimensions.

4. The process as claimed in claim 2, comprising, between steps c) and d), the following steps:
   b') coating the screen with additional photocrosslinkable emulsion in the double-mask zone; then
   c') drying the screen.

5. The process as claimed in claim 2, wherein the photocrosslinkable emulsion is coated onto the entirety of the surface of the main mask.

6. The process as claimed in claim 1, wherein the screen-printing screen is placed so that the or each secondary mask is turned toward the glass sheet.

7. The process as claimed in claim 1, wherein the electrically conductive paste is a silver-containing paste.

8. The process as claimed in claim 7, wherein the silver-containing electrically conductive paste comprises, in the wet state, at most 75% by weight silver.

9. The process as claimed in claim 1, wherein the at least one secondary mask is fastened to the face of the main mask by (a) coating a photocrosslinkable emulsion on at least a portion of the face of the main mask and (b) cross-linking the photocrosslinkable emulsion.

10. The process as claimed in claim 9, wherein the photocrosslinkable emulsion is coated onto the entirety of the surface of the main mask.

11. The process as claimed in claim 1, wherein the electrically conductive paste is deposited on the screen-printing screen using a squeegee.

12. The process as claimed in claim 1, wherein the angle α is comprised between 15 and 80°.

13. The process as claimed in claim 12, wherein the angle α is comprised between 15 and 60°.

14. The process as claimed in claim 13, wherein the angle α is comprised between 15 and 50°.

15. The process as claimed in claim 14, wherein the angle α is comprised between 15 and 35°.

16. The process as claimed in claim 1, wherein the main mask is such that a number of wires per cm in the central portion is higher than a number of wires per cm in the at least one lateral portion, and a diameter of the wires in the central portion is smaller than a diameter of the wires in the at least one lateral portion.

17. The process as claimed in claim 1, wherein a number of wires per cm of the at least one secondary mask is lower than a number of wires per cm of the main mask in the central portion and a diameter of the wires of the secondary mask is larger than a diameter of the wires of the main mask in the central portion.

18. The process as claimed in claim 1, wherein some of the apertures of the screen-printing screen are blocked with a resin obtained by exposing a photocrosslinkable emulsion, said at least one secondary mask being fastened to a face of said main mask using said resin.

19. The process as claimed in claim 1, wherein the thickness e1 is comprised between 8 and 15 μm, and the thickness e2 is comprised between 2 and 5 μm.

20. The process as claimed in claim 1, wherein the glazing is a motor-vehicle rear windshield, the electrically conductive patterns being antennas, bus bars and/or heating wires, and the at least one thick electrically conductive pattern being a soldering zone for antenna connection.

* * * * *